(12) United States Patent
Pascucci (10) Patent No.: US 6,373,781 B1
(45) Date of Patent: Apr. 16, 2002

(54) PRIORITY DETERMINING CIRCUIT FOR NON-VOLATILE MEMORY

(75) Inventor: Luigi Pascucci, Sesto San Giovanni (IT)

(73) Assignee: STMicroelctronics S.r.l., Agrate Brianza (IT)

( * ) Notice: Subject to any disclaimer, the term of this patent is extended or adjusted under 35 U.S.C. 154(b) by 0 days.

(21) Appl. No.: 09/499,799

(22) Filed: Feb. 8, 2000

(51) Int. Cl.[7] .............................................. G11C 16/04
(52) U.S. Cl. .............................. 365/230.08; 365/185.11
(58) Field of Search ....................... 365/230.08, 185.11, 365/185.08, 236, 239, 233, 233.5

(56) References Cited

U.S. PATENT DOCUMENTS 5,586,081 A * 12/1996 Mills ..................... 365/230.08
5,808,944 A * 9/1998 Yoshitake .................. 365/236

* cited by examiner

Primary Examiner—A. Zarabian
(74) Attorney, Agent, or Firm—Jenkens & Gilchrist, P. C.

(57) ABSTRACT

A priority determining circuit for a non-volatile memory formed by at least one pair of memory banks, each bank having a counter, including a circuit for latching a read address of the memory; a master latch circuit for the address; a slave latch circuit for the address; a pointer circuit for read paths of the memory bank to be read of the memory, stimulated by the master latch circuit; a circuit for enabling a path for connecting the master latch circuit and the slave latch circuit; a circuit for enabling a path for connecting the slave latch circuit and the master latch circuit; a circuit for managing the increment of the counters which is connected to the slave latch circuit; the read address of the memory being loaded by the master latch circuit into the slave latch circuit and then by the slave latch circuit into the master latch circuit alternately, the master latch circuit synchronizing a timer circuit of the memory which is meant to activate sense amplifiers of the memory and the slave latch circuit driving the circuit for managing the increment of the counters, for an advancement of the read cycle of the memory.

31 Claims, 5 Drawing Sheets

PRIORITY DETERMINING CIRCUIT FOR NON-VOLATILE MEMORY

BACKGROUND OF THE INVENTION

The present invention relates to a priority determining circuit for a non-volatile memory formed by at least two memory banks.

More particularly, the invention relates to a priority determining circuit for non-volatile memory which controls the functional development of the memory banks that constitute the memory, ensuring their correct operation and determining, in each individual instance, interdependent priorities and synchronizations.

It is known that a non-volatile memory generally comprises a single array which is addressed from outside and is univocally associated with a read mode which allows to extract from it the information item at the chosen memory location.

Such a memory requires no particular sub-block management, since it only has to perform controls and optimizations of internal propagations of the signals.

Clearly, this architecture is preferred when no particular speed performance is required: its simplicity and compact size are the foundations of its stability.

However, when a memory is required to have extreme speed, the above solution is not satisfactory; accordingly, more complex and innovative design approaches have been devised, such as page-mode reading, parallel reading, and the so-called interleaved architecture.

In the field of extremely fast memory architectures, memories of the interleaved type are particularly important. These memories, which assume long sequences of sequential read operations, are organized so as to start two read processes which are parallel as regards the propagation complementarity characteristics and the activity of the memory.

In this manner, the two fundamental steps of a read cycle (pre-charge and evaluation) occur together between the two read processes, with a temporally "interleaved" mode.

In order to provide a memory with the above-described characteristics it is necessary to organize the array, the corresponding structures indirectly and the read circuits into two identical and distinct but independent banks. Accordingly, it is evident that there is a need to provide control and synchronization between the two perfectly identical banks in the memory which must be implemented and provided even in the absence of external pointers.

SUMMARY OF THE INVENTION

The aim of the present invention is to provide a priority determining circuit for a non-volatile memory which allows to manage the evolution of two parallel read streams in a memory, controlling its functional evolution.

Within the scope of this aim, an object of the present invention is to provide a priority determining circuit for non-volatile memories which allows to manage the evolution of the two read streams, determining which of the two banks of the memory must be set to evaluation mode and which one must be set to pre-charge mode and which one must be updated in its affected location and which one must not be updated.

Another object of the present invention is to provide a priority determining circuit for non-volatile memories which allows to suspend the interleaved mode of the memory, allowing reading with exclusively external addressings.

Another object of the present invention is to provide a priority determining circuit for non-volatile memories which allows to preset separate time intervals for updating activities between the read paths of each memory bank and the counters.

Another object of the present invention is to provide a priority determining circuit for a non-volatile memory which is highly stable, relatively easy to provide and at competitive costs.

This aim, these objects and others which will become apparent hereinafter are achieved by a priority determining circuit for a non-volatile memory formed by at least one pair of memory banks, each bank having a counter, characterized in that it comprises:

means for latching a read address of said memory;

master latch means for said address;

slave latch means for said address;

pointer means for read paths of the memory bank to be read of said memory, stimulated by said master latch means;

means for enabling a path for connecting said master latch means and said slave latch means;

means for enabling a path for connecting said slave latch means and said master latch means;

means for managing the increment of said counters which are connected to said slave latch means;

said read address of said memory being loaded by said master latch means into said slave latch means and then by said slave latch means into said master latch means alternately, said master latch means synchronizing timer means of said memory which are meant to activate sense amplifiers of said memory and said slave latch means driving said means for managing the increment of said counters, for an advancement of the read cycle of said memory.

BRIEF DESCRIPTION OF THE DRAWINGS

Further characteristics and advantages of the invention will become apparent from the description of a preferred but not exclusive embodiment of the priority determining circuit according to the invention, illustrated only by way of non-limitative example in the accompanying drawings, wherein.

DESCRIPTION OF THE PREFERRED EMBODIMENTS

Figure 1:
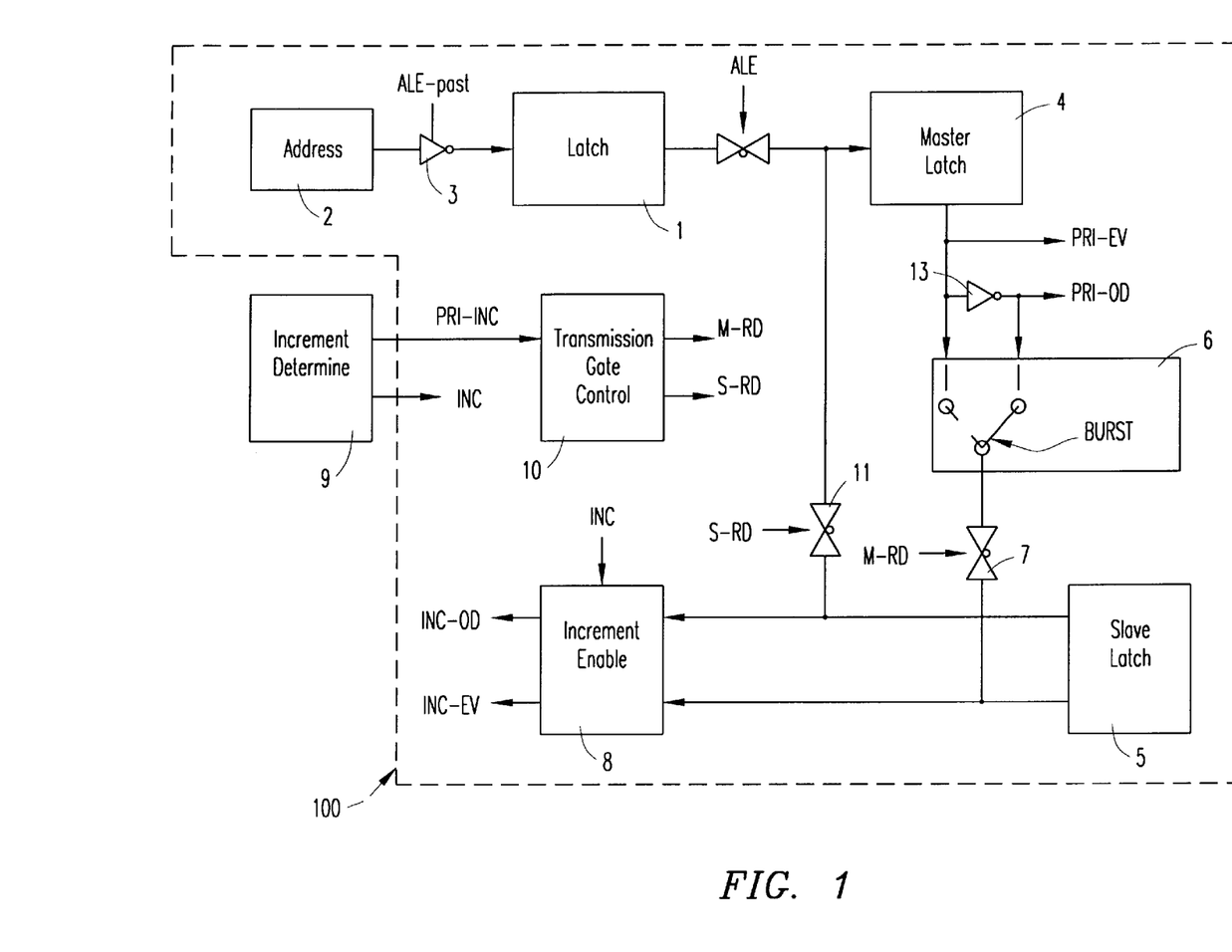
FIG. 1 is a block diagram of the priority determining circuit according to the present invention.

With reference to the above-cited figures, and initially to FIG. 1, the priority determining circuit according to the present invention comprises address latching means 1, constituted by a latch, which are suitable to store an address 2 that originates from outside the memory and passes through a structure 3 of the tristate type which is driven by a signal ALE-fast which allows to enable the passage of the address 2 in the latch means 1.

The output of the latch means 1 is fed to master latch means 4 which are conveniently constituted by a latch and the passage of the data from the latch means 1 to the latch means 4 is driven by a pass transistor, which is enabled by a signal ALE which indicates address latch enabling.

The master latch means are in turn connected, by means of a suitable path, to slave latch means 5 which allow to store, when suitable conditions occur, the contents of the master latch means 4.

The path that connects the master latch means 4 to the slave latch means 5 is formed by means for pointing read paths of the memory bank, designated by the reference numeral 6, with the particularity of adding or not inversions on said path, depending on the state of a signal BURST, which indicates the reading of said memory in sequential mode. The pointer means are directly connected to the master latch means 4 and are in turn connected to means for enabling the connection between the master latch means and the slave latch means, designated by the reference numeral 7.

The slave latch means 5 are connected, by means of signals PR-INC-OD and PRI-INC-EV, to means 8 for managing the increment to be assigned to the counters of the two memory banks, which emit in output a signal INC-OD for incrementing the odd memory bank and a signal INC-EV for incrementing the even memory bank, receiving in input the increment signal INC.

Said increment signal is generated by the means for determining the increment INC 9, which are the subject of a co-pending patent application in the name of this same Applicant and emit in output a signal INC and a signal PRI-INC for synchronization, which indicates which memory bank is to be read, and said signal PRI-INC is fed to means 10 for generating signals for enabling the path for connection between the master latch means 4 and the slave latch means 5.

Said connection enabling signals are the signals M-RD and S-RD for enabling, respectively, the connection between the master latch means 4 and the slave latch means 5 and between the slave latch means 5 and the master latch means 4.

The signal M-RD is used to enable the enabling means 7, while the signal S-RD is used to enable enabling means 11 which allow connection between the slave latch means 5 and the master latch means 4.

In detail, connection enabling means, designated by the reference numeral 12 and driven by the signal ALE, are present between the latch means 1 and the master latch means 4.

The signal in output from the master latch means 4 is the signal designated by PRI-EV, which further passes into inverting means 13 for generating the signal PRI-OD.

The signals PRI-EV and PRI-OD for indicating the memory bank to be read are fed to the read path pointer means of the memory bank to be read 6, whose switching is determined by the signal BURST, for continuous reading of the memory.

Figure 2:
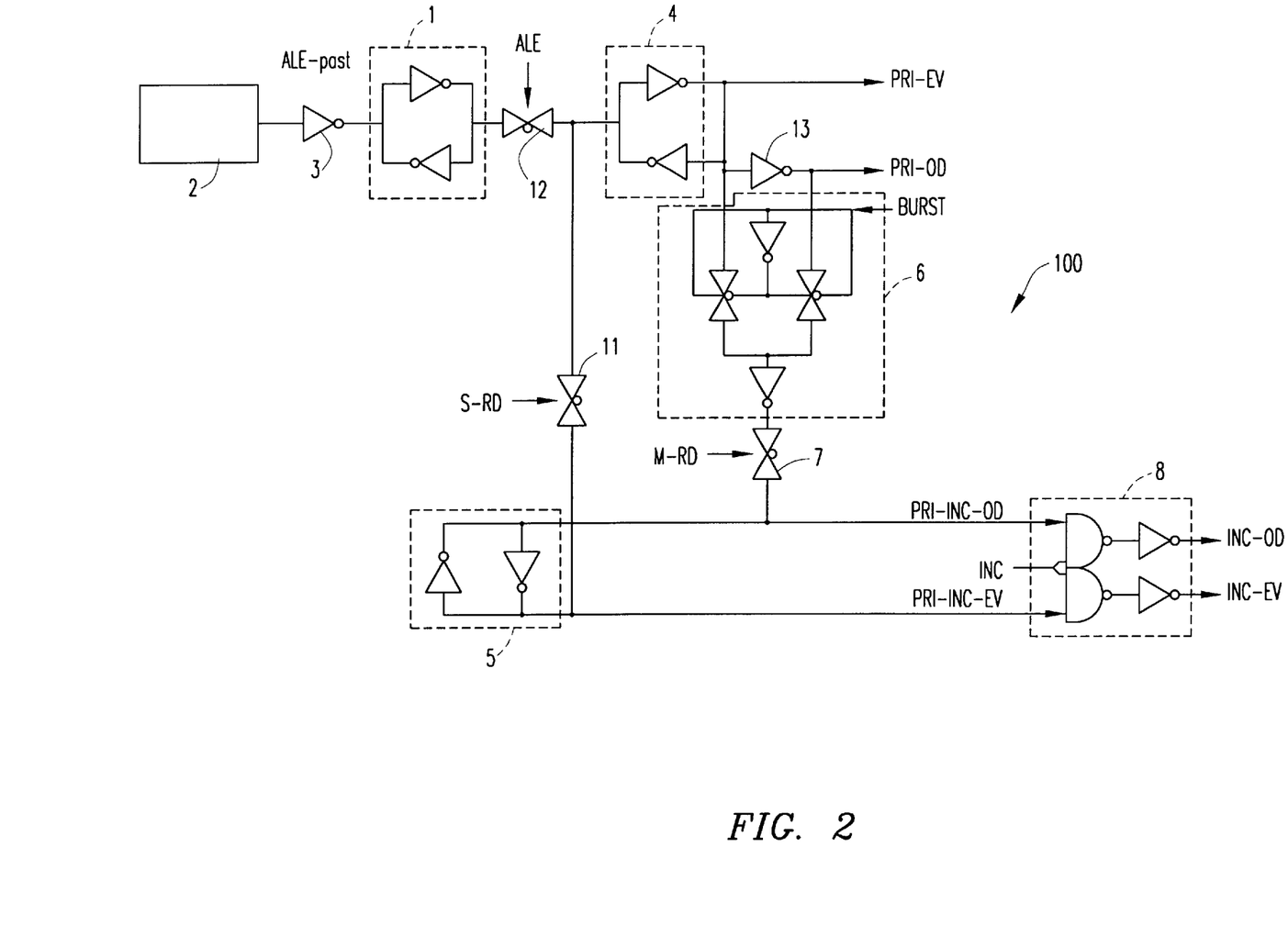
FIG. 2 is a circuit diagram of the priority determining circuit according to the present invention.

FIG. 2 is a circuit diagram that corresponds to the block diagram of FIG. 1. Said diagram is to be considered purely as an example, since the block diagram of FIG. 1 may be provided by using different but functionally similar circuit diagrams.

Figure 3:
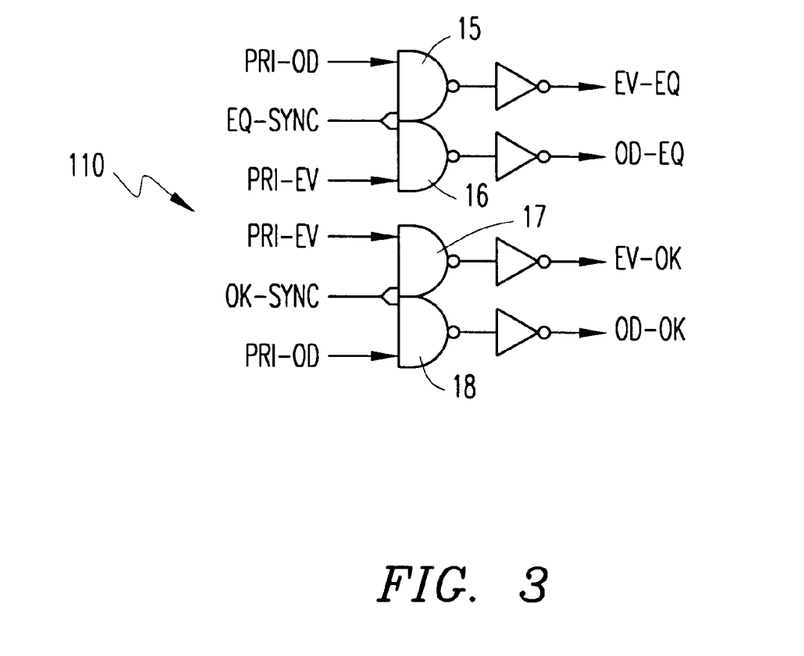
FIG. 3 is a block diagram of the timing management circuit used in combination in the priority management circuit according to the present invention.

FIG. 3 illustrates a logic circuit which shows the generation of signals EV-EQ, OD-EQ for controlling sense amplification, and signals EV-OK, OD-OK for controlling the odd and even memory banks, respectively.

Said logic circuit has NAND gates 15, 16, 17 and 18 which receive in input, for the gates 15 and 16, the signals PRI-OD (odd bank priority), EQ-SYNC (equalization synchronization) and PRI-EV (even memory bank priority), while the gates 17 and 18 receive in input the signal OK-SYNC, in order to generate the memory bank control signals.

Figure 4:
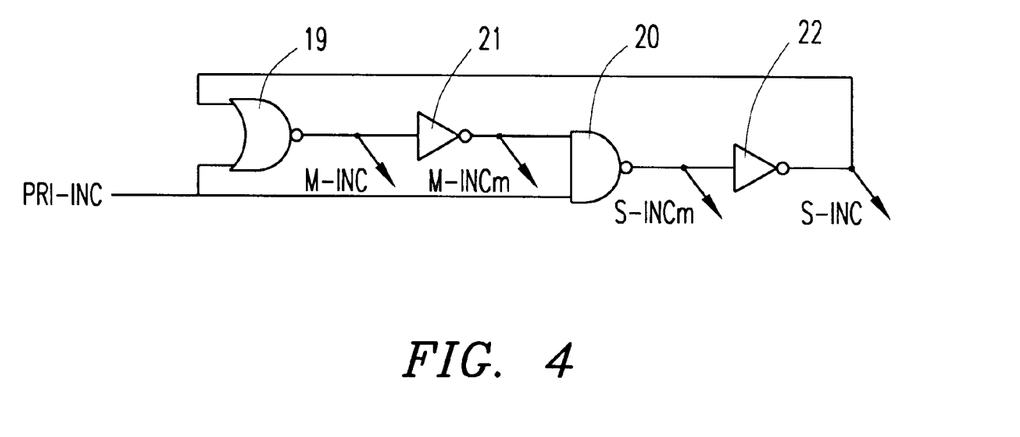
FIG. 4 is a circuit diagram of the read determining circuit of one of two master and slave latches of the priority determining circuit according to the invention.

FIG. 4 illustrates a logic circuit for generating the increment signals M-INC and S-INC for the master latch means 4 and the slave latch means 5, respectively.

The circuit of FIG. 4 is a formed by a NOR gate 19 which receives in input the signal PRI-INC at one input, said signal being also sent to a NAND gate 20. The output of the NOR gate 19 is the signal M-INC, which is fed to an inverter 21 and from there is fed, as second input M-INC, to the NAND gate 20.

The output of the NAND gate 20 is a signal S-INCn which is fed to a second inverter 22 whose output of the signal S-INC also constitutes the second input of the NOR gate 19.

Figure 5:
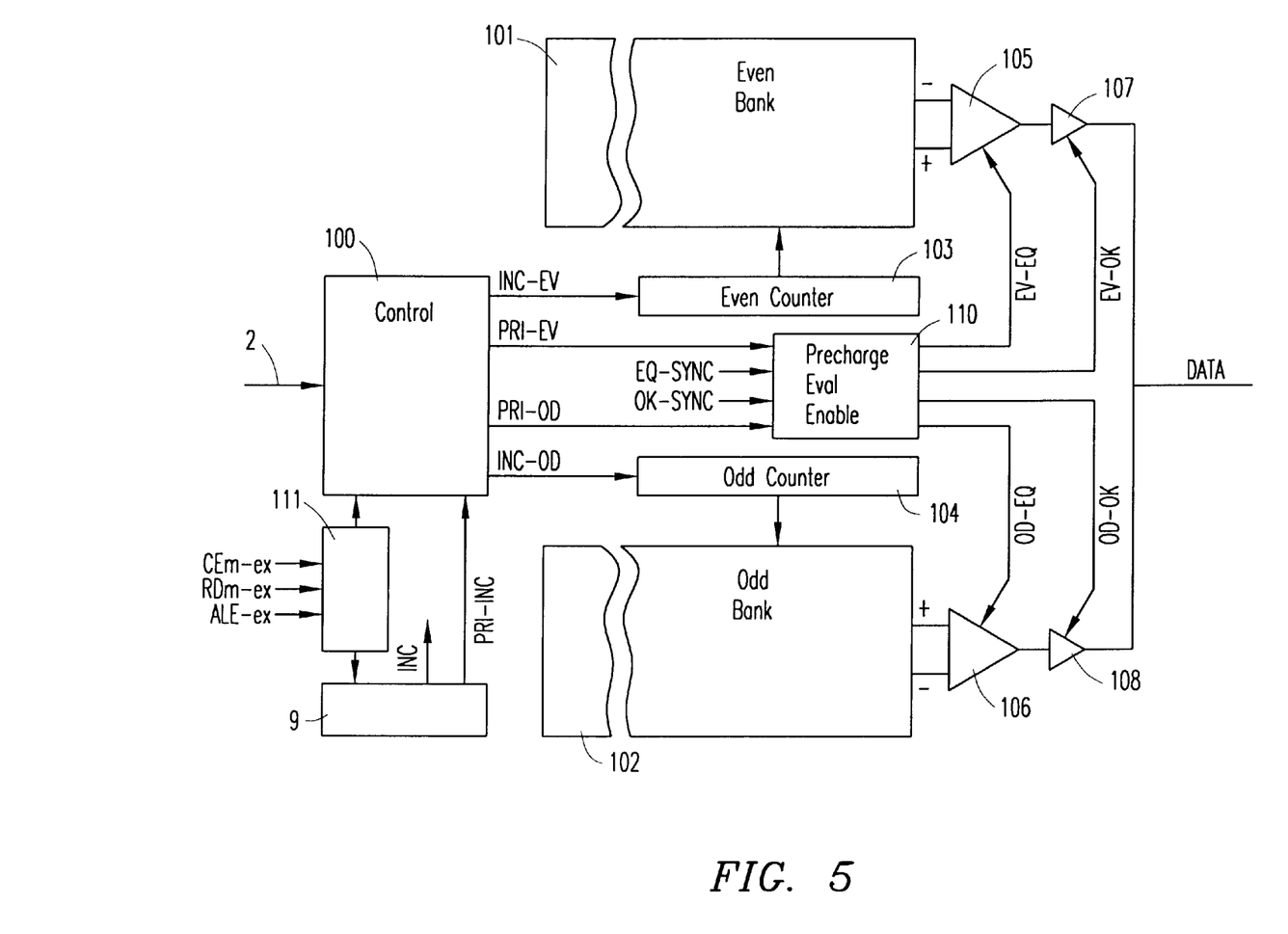
FIG. 5 is a block diagram of the memory architecture in which the priority determining circuit according to the present invention is inserted.

FIG. 5 illustrates an architecture of a memory with the priority determining circuit according to the invention, which is designated by the reference numeral 100. In this architecture, the reference numeral 101 designates an even memory array block, while the reference numeral 102 designates an odd memory array block. The reference numeral 103 designates a counter for the memory block 101 and the reference numeral 104 designates a counter which is similar to the counter 103 for the memory block 102.

Each memory block also has a respective sense amplifier 105 and 106 which is connected in output to a structure of the tristate type 107 and 108 from which the data in output from the sense amplifier are output.

A timing management unit 110 manages the pre-charge/evaluation steps of the amplifier means 105 and 106 by means of the control signals EV-EQ and OD-EQ and further controls the driving of the structures of the tristate type 107 and 108 which are meant to update the output information item by means of the signals EV-EQ, OD-EQ and EV-OK, OD-OK. Said timing management unit 110 is shown in detail in FIG. 3.

The reference numeral 9 instead designates the increment determining means, already shown in FIG. 1. Finally, the reference numeral 111 designates a control block which is interfaced between the priority determining circuit 100 according to the present invention and the increment determining means 9.

Figure 6:
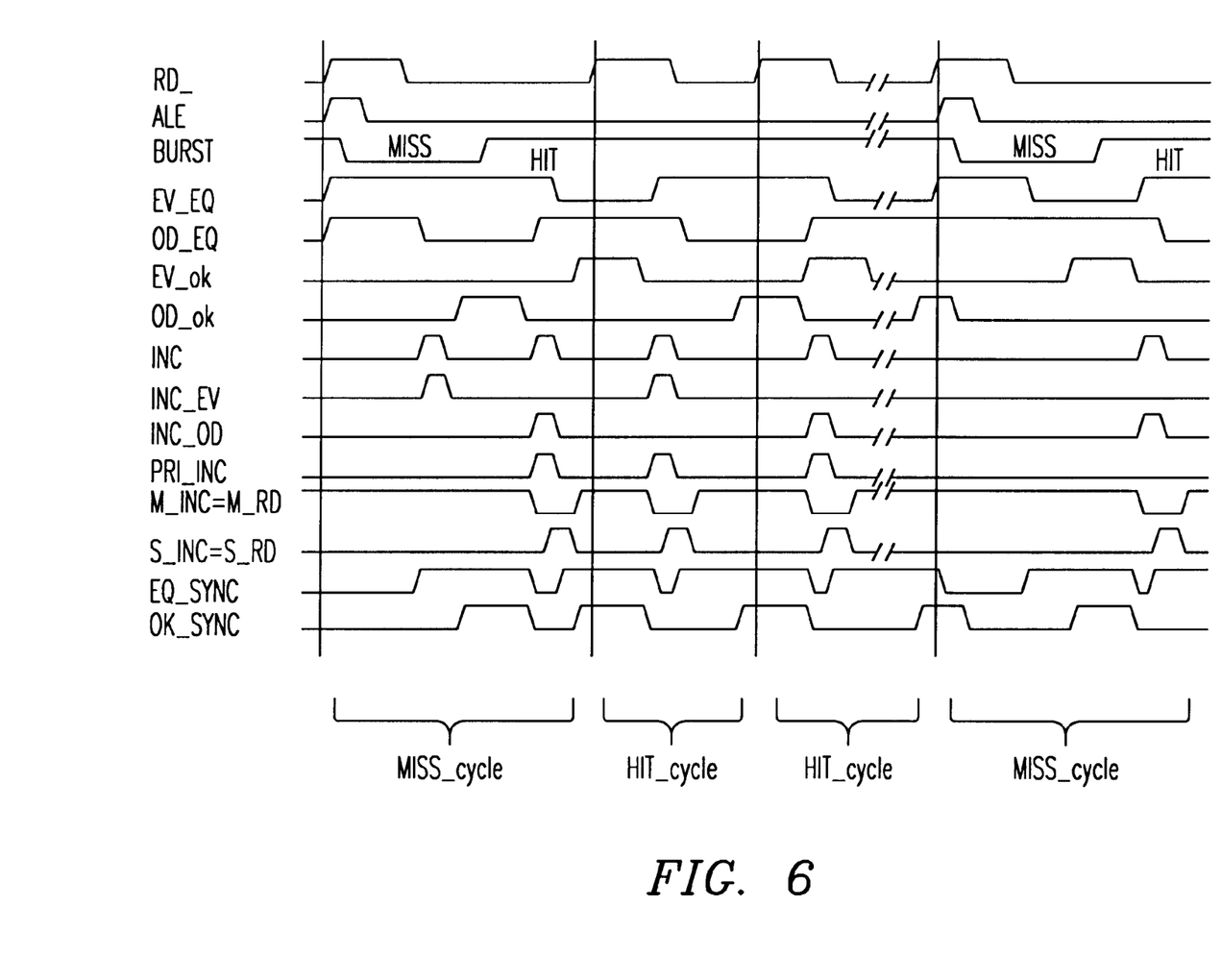
FIG. 6 is a waveform diagram illustrating an operation of the block diagram of the memory architecture shown in FIG. 5.

With reference to the above figures, and furthermore with reference to FIG. 6, which illustrates the timing of the various signals of the device, operation of the circuit according to the invention is as follows.

Two operating modes of the memory can be distinguished:
conventional mode (signal ALE=1 at all times)
interleaved or burst mode (signal ALE is pulsed, first "1" and then "0").

As regards the conventional mode, when the signal "ALE" is set and kept at "1", the external address configures and maintains the master latch means 4 and the slave latch means 5. In this way, the two pairs of signals PRI-EV, PRI-OD and INC-EV, INC-OD are set appropriately from outside.

Moreover, in this situation the signal BURST is at a low level (0), acting on the means for switching the read path of the memory, so as to select a path which provides an "even" number of inversions in the loop which is formed by the master latch means 4 and by the slave latch means 5 and is closed on the master latch means 4.

Said loop is interrupted at the level of the connection between the slave latch means 5 and the master latch means 4 by means of the pass gate 11 controlled by the signal S-RD, while the path between the master latch means 4 and the slave latch means 5 is kept continuously connected by the pass gate 7 controlled by the signal M-RD.

Since no synchronization pulse PRI-INC is possible in this configuration, the configuration of the circuit therefore does not change over time and therefore the pointing signals PRI-EV, PRI-OD and INC-EV, INC-OD are controlled directly from outside the memory.

As regards the interleaved or burst mode, it is always set starting from an initial conventional operating mode by means of the pulsed signal ALE (which is then kept at the low level 0), so that during the first cycle (which lasts from the pulse of ALE to the occurrence, generated inside the memory, of the high BURST signal "1"), the operation of the circuit is the same as in the above-described conventional mode.

When the signal BURST=1 occurs (and persists throughout the period of validity of the BURST mode, ALE=0) an additional inversion (selection of the output of the inverter 13 instead of its input) is introduced in the structure 6 of FIG. 2 (by means of the action of BURST) in the loop formed by the master 4, the slave 5 and the master 4, so that since said inversion is odd, at each event of the pulse PRI-INC the circuit modifies its configuration, thus updating the pointing of the banks PRI-EV, PRI-OD, and of the counters INC-OD, INC-EV. All this occurs in an alternating succession.

The primary signals PRI-EV and PRI-OD allow to control in an orderly fashion the pairs EV-EQ, OD-EQ and EV-OK, OD-OK.

It is important to note (see FIG. 6) that the updating of the controls related to the read paths occurs at the beginning of the update pulses PRI-INC and simultaneously with the generation of the pulse INC-EV or INC-OD, while the signals meant to update the increment PRI-INC-OD occur at the end, and only at the end, of the update pulse PRI-INC.

This is devised in order to prevent "chasing" phenomena and oscillations in the system.

It is also important to consider the fact that access from outside to the update circuit is performed by means of a filter network so as to prevent false requests for configuration from outside, which are often induced by noise.

The signals that arrive from the priority circuit (PRI-EV and PRI-OD) are then combined with the synchronization signal EQ-SYNC in a synchronous and complementary manner (when SYNC is activated) with respect to the pre-charge/evaluation activities of the two memory banks. Likewise, the same priority signals, combined with an additional synchronization signal OK-SYNC, enable the data transfer, in an exclusive mode, from the read circuits to the output structures by virtue of the activation of one of the two enable signals EV-OK or OD-OK.

Dually, a suitable synchronization signal INC, under the control of the priority increment signals PRI-INC-OD and PRI-INC-EV, selects the activation of one of the two signals INC-OD and INC-EV, thus causing the increment of the corresponding associated counter and only of that counter.

Attention is also drawn to the characteristic of the priority updating control network, which by being stimulated by the synchronization pulses PRI-INC produces signals in pairs which do not mutually overlap for controlling the connection between the master part and the slave part.

What is claimed is:

1. A nonvolatile memory device, comprising:
    a first memory bank of nonvolatile memory cells;
    a first counter operable to increment a value stored therein, an output of the first counter providing an address to the first memory bank;
    a second memory bank of nonvolatile memory cells;
    a second counter operable to increment a value stored therein, an output of the second counter providing an address to the second memory bank; and
    control circuitry for controlling the nonvolatile memory device to selectively perform memory access operations, comprising:
        a master latch selectively coupled to receive an address value, a logic state of the master latch selectively enabling precharge and evaluation control signals for the first and second memory banks during memory access operations;
        switching circuitry for coupling any of a true and a complement representation of the logic state of the master latch to an output of the switching circuitry based upon whether the nonvolatile memory device is in an interleaved burst mode;
        a slave latch coupled to the output of the switching circuitry, a logic state of the slave latch selectively and individually enabling a counter clock signal for each of the first and second counters; and
        feedback circuitry for selectively connecting the slave latch to the master latch during memory access operations in a burst of memory access operations when the nonvolatile memory device is in the interleaved burst mode, the feedback circuitry flipping the logic state of the master latch when activated for a next memory access operation in the burst.

2. The nonvolatile memory device of claim 1, wherein:
    the switching circuitry provides at least one first signal path between the master and slave latches: and
    the feedback circuitry comprises a first transmission gate coupled between the master and slave latches along at least one first signal path, and a second transmission gate coupled between the master and slave latches to provide a second signal path between the master and slave latches.

3. The nonvolatile memory device of claim 2, wherein:
    the first transmission gate is coupled between the switching circuitry and the slave latch.

4. The nonvolatile memory device of claim 2, wherein:
    the first transmission gate and the second transmission gate are enabled by nonoverlapping control signals.

5. The nonvolatile memory device of claim 2, further comprising:
    a timing circuit for generating nonoverlapping control signals during memory access operations in the burst of memory access operations, the nonoverlapping signals being applied to the control terminals of the first and second transmission gates.

6. The nonvolatile memory device of claim 5, wherein:
    the timing circuit maintains the first transmission gate in a normally closed state and the second transmission gate in a normally open state during memory access operations in the burst.

7. The nonvolatile memory device of claim 5, wherein:
in a memory access operation in the burst, the timing circuit substantially concurrently opens the first transmission gate and closes the second transmission gate, substantially immediately following the occurrence of a triggering edge of the counter clock signal.

8. The nonvolatile memory device of claim 1, wherein:
the feedback circuitry is disabled when the nonvolatile memory device is in a normal mode of operation.

9. The nonvolatile memory device of claim 1, wherein:
when in a normal mode of operation, the control circuitry allows the master and slave latches to be controlled externally to the nonvolatile memory device.

10. The nonvolatile memory device of claim 1, wherein:
the feedback circuitry is disabled during a first memory access operation in the burst, and enabled to flip the logic state of the master latch in substantially each memory access operation in the burst following the first memory access operation.

11. The nonvolatile memory device of claim 10, wherein:
the switching circuitry couples to the slave latch the true representation of the logic state of the master latch during the first memory access operation, and couples to the slave latch the complement representation of the logic state of the master latch during memory access operations following the first memory access operation in the burst.

12. A method of performing memory access operations on a nonvolatile memory device having two banks of memory cells and a distinct address counter associated with each bank, the method comprising:
latching at least one bit of an input address into a master latch;
enabling precharge and evaluation cycles of a memory access operation for any one of the memory banks based upon the value latched in the master latch;
generating true and complement representations of the at least one bit latched in the master latch;
selectively providing any of the true and complement representations of the at least one bit latched in the master latch based upon whether the nonvolatile memory device is configured in an interleaved burst mode;
latching in a slave latch the representation of the signal provided during the step of selectively providing; and
selectively and individually enabling a counter clock signal for each of the address counters based upon the value latched in the slave latch.

13. The method of claim 12, further comprising:
upon an affirmative determination that the nonvolatile memory device is performing a memory access operation in a burst of memory access operations, logically inverting the value latched in the master latch to enable precharge and evaluation cycles for a next memory access operation in the burst.

14. The method of claim 13, wherein:
the steps of selectively providing and latching in the slave latch occur along a first circuit path between the master and slave latches; and
the step of logically inverting comprises coupling the slave latch to the master latch along a second circuit path while decoupling the first circuit path, the first and second current paths providing a combined inverted logic loop between the master and slave latches.

15. The method of claim 12, wherein:
the step of selectively providing provides the complement representation of the at least one bit latched in the master latch when the nonvolatile memory device is performing a memory access operation in the burst.

16. The method of claim 12, wherein:
the step of selectively providing provides the true representations of the at least one bit latched in the master latch when the nonvolatile memory device is configured in a normal mode.

17. The method of claim 12, further comprising:
upon an affirmative determination that the nonvolatile memory device is not performing a memory access operation in a burst, latching at least one bit of a new address in the master latch for a next memory access operation.

18. The method of claim 12, wherein:
the step of selectively providing provides the true representation of the at least one bit latched in the master latch when the nonvolatile memory device is performing a first memory access operation in a burst and while the nonvolatile memory device is configured in a interleaved burst mode.

19. A control circuit for a nonvolatile memory device including a first memory bank of nonvolatile memory cells, a first counter associated with the first memory bank, a second memory bank of nonvolatile memory cells, a second counter associated with the first memory bank, and a second counter associated with the second memory bank, the control circuit comprising:
a master latch for latching at least one address bit of an input address, a logic state of the master latch selectively enabling precharge and evaluation control signals for the first and second memory banks during memory access operations;
switching circuitry for coupling any of a true and a complement representation of the logic state of the master latch to an output of the switching circuitry based upon whether the nonvolatile memory device is in an interleaved burst mode; and
a slave latch coupled to the output of the switching circuitry, a logic state of the slave latch selectively and individually enabling a counter clock signal for each of the first and second counters; and
feedback circuitry for selectively connecting the slave latch to the master latch during memory access operations in the interleaved burst mode, the feedback circuitry flipping the logic state of the master latch when activated for a next memory access operation.

20. The circuit of claim 19, wherein:
the switching circuitry provides at least one first signal path between the master and slave latches; and
the feedback circuitry comprises a first transmission gate coupled between the master and slave latches along the at least one first signal path, and a second transmission gate coupled between the master and slave latches to provide a second signal path between the master and slave latches.

21. The circuit of claim 20, wherein:
the first transmission gate is coupled between the switching circuitry and the slave latch.

22. The circuit of claim 20, wherein:
the first transmission gate and the second transmission gate are enabled by nonoverlapping control signals.

23. The circuit of claim 20, further comprising:

a timing circuit for generating nonoverlapping control signals during memory access operations in a burst when the nonvolatile memory device is configured in the interleaved burst mode, the nonoverlapping signals being applied to the control terminals of the first and second transmission gates.

24. The circuit of claim 23, wherein:

the timing circuit maintains the first transmission gate in a normally closed state and the second transmission gate in a normally open state during memory access operations in a burst.

25. The circuit of claim 23, wherein:

in a memory access operation in the burst, the timing circuit substantially concurrently opens the first transmission gate and closes the second transmission gate following the occurrence of a triggering edge of one of the counter clock signals.

26. The circuit of claim 19, wherein the feedback circuitry is disabled when the nonvolatile memory device is in a normal mode of operation.

27. The circuit of claim 19, wherein:

when in a normal mode of operation, the control circuitry allows the master and slave latches to be controlled externally to the nonvolatile memory device.

28. The circuit of claim 19, wherein:

the feedback circuitry is disabled during a first memory access operation in the burst, and enabled to flip the logic state of the master latch in substantially each memory access operation in the burst following the first memory access operation.

29. The circuit of claim 19, wherein:

the switching circuitry couples to the slave latch the true representation of the logic state of the master latch during the first memory access operation, and couples to the slave latch the complement representation of the logic state of the master latch during memory access operations following the first memory access operation in the burst.

30. A nonvolatile memory device, comprising:

a first memory bank of nonvolatile memory cells;

a first counter operable to increment a value stored therein, an output of the first counter providing an address to the first memory bank;

a second memory bank of nonvolatile memory cells;

a second counter operable to increment a value stored therein, an output of the second counter providing an address to the second memory bank; and control circuitry for controlling the nonvolatile memory device to selectively perform memory access operations, comprising:

master storage means for storing at least one bit of an input address, a logic state of the master storage means selectively enabling precharge and evaluation control signals for the first and second memory banks during memory access operations;

means for generating a true and a complement representation of the logic state of the master storage means based upon whether the nonvolatile memory device is in an interleaved burst mode; and slave storage means for selectively latching any one of the true and complement representations of the logic state of the master storage means, a logic state of the slave storage means selectively and individually enabling a counter clock signal for each of the first and second counters during a memory access operation in a burst.

31. The nonvolatile memory device of claim 30, further comprising:

feedback means for selectively connecting the slave storage means to the master storage means during memory access operations in a burst, the feedback circuitry flipping the logic state of the master storage means when activated for a subsequent memory access operation in the burst.

\* \* \* \* \*